United States Patent
Laermer et al.

[11] Patent Number: 6,008,138
[45] Date of Patent: Dec. 28, 1999

[54] PROCESS FOR MAKING MICROMECHANICAL STRUCTURES

[75] Inventors: Franz Laermer, Stuttgart; Andrea Schilp, Schwaebisch Gmuend, both of Germany

[73] Assignee: Robert Bosch GmbH, Stuttgart, Germany

[21] Appl. No.: 08/814,760

[22] Filed: Mar. 7, 1997

[30] Foreign Application Priority Data

Mar. 19, 1996 [DE] Germany .......................... 196 10 782

[51] Int. Cl.$^6$ .................................................. H01L 21/302
[52] U.S. Cl. .......................................... 438/725; 438/735
[58] Field of Search ................................ 438/725, 735, 438/736, 780

[56] References Cited

U.S. PATENT DOCUMENTS

| | | | |
|---|---|---|---|
| 5,270,259 | 12/1993 | Ito et al. | 437/235 |
| 5,374,792 | 12/1994 | Ghezzo et al. | 200/16 B |
| 5,472,539 | 12/1995 | Saia et al. | 156/155 |
| 5,698,112 | 12/1997 | Naeher et al. | 216/2 |

FOREIGN PATENT DOCUMENTS 42 41 045  5/1994  Germany .

*Primary Examiner*—William Powell
*Assistant Examiner*—Bernadine Okoro
*Attorney, Agent, or Firm*—Kenyon & Kenyon

[57] ABSTRACT

A process for structuring a movable element out of a membrane region. A sacrificial layer and a sealing layer are applied to the underside of the membrane region. Following removal of the sacrificial layer, sealing layer forms a limit stop and a seal for the movement of the movable element.

12 Claims, 1 Drawing Sheet

PROCESS FOR MAKING MICROMECHANICAL STRUCTURES

BACKGROUND INFORMATION

Processes for making micromechanical rotational speed sensors are known from German Patent Application No. 1 95 26 903. According to this patent application, a membrane region is created in a silicon wafer by etching out a cavity so that this membrane region is thinner than the silicon wafer. By further etching processes, a movable element is then etched out of the membrane region. To limit the deflection of this movable element, various processes for creating limit stops have been described. These processes for creating limit stops have in common the feature that at least one additional wafer, particularly a silicon wafer, is needed to make them. Moreover, connecting this wafer with the silicon wafer from which the movable element was etched out requires a tedious procedure.

SUMMARY OF THE INVENTION

An advantage of the process according to the present invention is that no additional wafer is needed to create the limit stop. The process of the present invention can thus be carried out with unusually low amounts of materials and using relatively simple processing techniques.

The sacrificial layer on the bottom side of the membrane region can be produced in particularly simple manner by evaporation of a polymer solution. In a subsequent etching step, the thin polymer film can then be removed from the cavity walls to ensure reliable adhesion between the material subsequently applied for the stop and the cavity walls. A suitable material for the limit stop is, in particular, an epoxy or silicone polymer. Silicone polymers also have the advantage of causing unusually low mechanical strains because of their elasticity and particularly good sealing properties. By depositing a metallic layer to the underside of the membrane region, a nearly perfect etch stop is achieved during plasma structuring of the membrane. If desired, the metallic layer can then be removed from the underside through a subsequent etching. It is also possible, by use of SOI (silicon-on-insulator) wafers, to provide as the etch stop layer a buried oxide which on both sides acts in a process-limiting or process-stopping manner. The structuring of the membrane region is advantageously carried out by use of a fluorine-containing gas (in accordance with German Patent Application No. DE 42 41 045). The cavity is introduced in the silicon wafer very simply through use of an anisotropic etching solution. The slanted walls thus formed also facilitate removal of the thin polymer layer from the walls.

DETAILED DESCRIPTION

Figure 1:
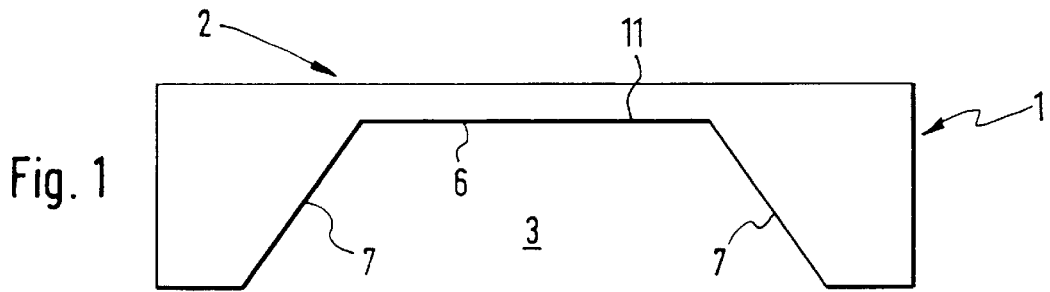
FIG. 1 illustrates a first step of the process according to the present invention.

FIG. 1 shows a silicon wafer 1 from which a membrane region was structured by forming a cavity 3. Membrane region 2 is appreciably thinner than the remainder of silicon wafer 1. Cavity 3 has a bottom region 6 and walls 7. Bottom region 6 of cavity 3 at the same time constitutes the underside 11 of membrane region 2.

To form such cavities 3 in silicon wafers 1, an etching process capable of anisotropically etching single-crystal silicon is usually employed. Basic etching solutions, for example, can be used for this purpose. Other etching processes capable of producing cavities in silicon wafer 1, however, can also be used.

Figure 2:
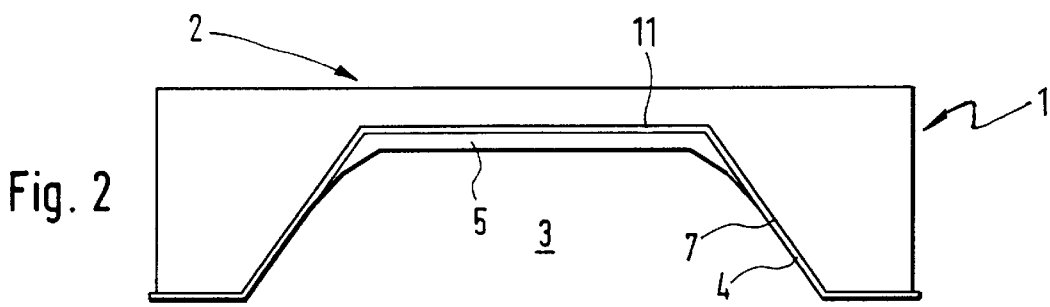
FIG. 2 illustrates a second step of the process according to the present invention.
Figure 3:
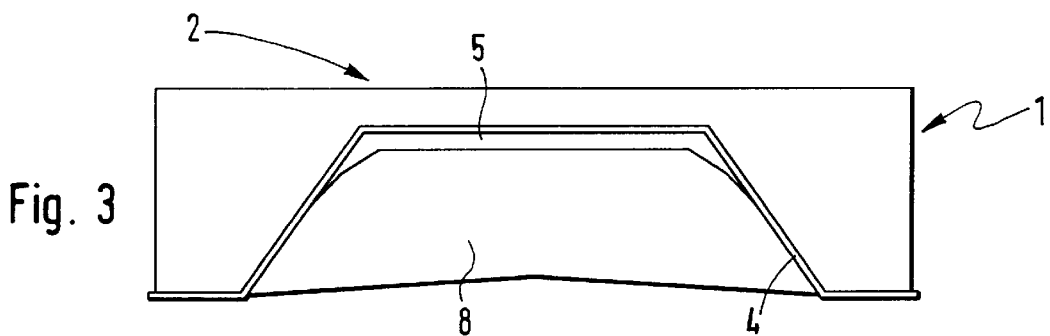
FIG. 3 illustrates a third step of the process according to the present invention.

A thin metallic layer of, for example, aluminum, chromium, nickel or the like is then applied to underside 11 of membrane region 2 by deposition, particularly vapor deposition, or sputtering. When the deposition is carried out without using a mask, then, as shown in FIG. 2, walls 7 of cavity 3 and the underside of silicon wafer 1 are also covered with a metal layer 4. Metal layer 4 is used as an etch stop in the subsequent structuring of membrane region 2 and can be very thin, for example on the order of a few tens of nanometers. If the subsequent structuring of membrane region 2 is carried out by an etching process for which no etch stop is required, the application of metal layer 4 may be omitted. It is also possible to use the buried oxide of an SOI wafer as a two-sided etch stop.

In a next process step (see FIG. 2), a thick sacrificial layer 5 is produced in the region of underside 11 of membrane region 2. To produce sacrificial layer 5, cavity 3 is filled with a polymer solution. Suitable polymers for this purpose are, for example, those used as photoresists in optical lithography, polystyrene or other polymers that dissolve in solvents such as acetone, aromatic solvents or chlorocarbons. Evaporation of the solvent then causes a polymer film to form on bottom 6 of cavity 3, the thickness of this film being determined by the concentration of the solution used and the amount of solution introduced into cavity 3. Moreover, a thin polymer film is also formed on walls 7 of the cavity, the thickness of this film, however, being less than that of the film applied to bottom region 6. To remove this thin polymer film from walls 7, a subsequent etching step, for example an isotropic plasma etching step, is carried out in an oxygen plasma. This step completely removes the thin film from walls 7 of cavity 3. Because of the greater thickness of sacrificial layer 5 in the area of cavity bottom 6, the thickness of this layer is thereby changed only insignificantly. It is also possible to introduce into the cavity an exactly measured amount of coating or polymer material so that only the bottom is covered. This requires an appropriate coating measuring system capable of delivering to each individual cavity the correct amount of coating material required for achieving the desired coating layer height.

In a next step, cavity 3 is filled with a sealing layer 8. This sealing layer 8 can consist of, for example, epoxy resin, silicone polymer or some other suitable material. Silicone polymers have the advantage of remaining elastic even after they have been crosslinked and, thus, exert only minor mechanical stresses on the silicon wafer. The drawback of silicone is that further processing of the silicon wafer is optionally carried out with hydrofluoric acid-containing etching solutions to which silicone polymers are not fully resistant.

Figure 4:
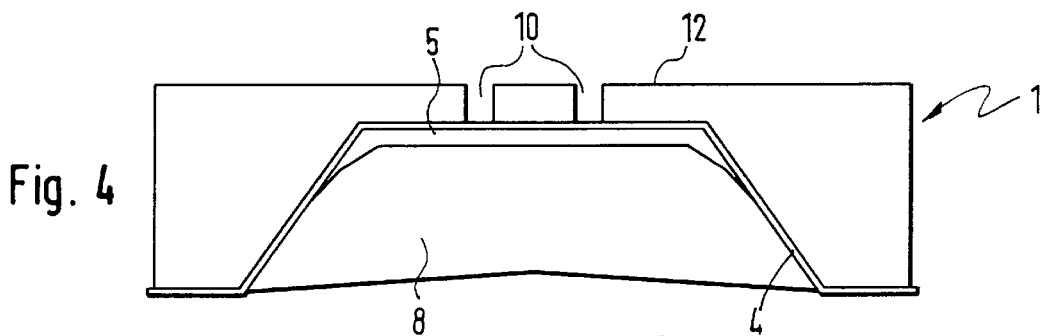
FIG. 4 illustrates a fourth step of the process according to the present invention.

In a subsequent process step, the membrane region is structured so as to create trenches 10 which are introduced in membrane region 2 from its top side 12. This stage is shown in FIG. 4. To produce the trenches, an etching process that stops at metal layer 4 can be used, for example a process using a fluorine-containing plasma as described in German Patent Application No. DE 42 41 045. Here, metal layer 4 thus serves as an etch stop. This ensures that the etching process will not etch sacrificial layer 5 as this could undercut the micromechanical structures and result in a loss of structural fidelity.

When during the etching of trenches having an aspect ratio>1, a dielectric interface is reached, for example a photoresist, PMMA, polyimide, BCB or some other polymeric material, $SiO_2$, SiON, SiC, LTO, TEOS or some other inorganic dielectric, strong electric fields are generated in the edge area of the silicon-dielectic transition as a result of charge accumulation on the dielectric etch base relative to the already etched silicon structure. This results in pocket-shaped undercuts with structure loss at the edge. The reason for this is that for an aspect ratio>1, the etch base is reached by increasingly more ions that fall on the wafer in a more highly directed manner (almost perpendicularly) than the electrons, whereas a number of electrons, which increases with the aspect ratio, strike in a less directed manner, falling on the silicon side wall, and are freely mobile within the silicon. The trench having aspect ratio>1 thus acts as an aperture which allows only the directed ions to pass through to the etch base, whereas the less directed electrons are filtered out. This is not harmnful as long as the etch base is an electrically conductive material, for example silicon that has not yet been completely etched through, and which is conductively connected with the etched silicon structures: the electrons that are freely mobile within the silicon simply migrate from the side wall region where they entered the silicon to the etch base where they neutralize the incident, positively charged ions, which are more concentrated here, and are trapped at the etch base.

When an electrically insulating material (the etch stop layer or the dielectric) is reached, however, this neutralization can no longer take place in this manner: the positively charged ions accumulate increasingly on the etch base, while the electrons accumulate on the silicon edges in the transition region to the dielectric without being able to neutralize the trapped ions through the insulator. As a result of this charge accumulation, in the event of overetching, many of the subsequently striking ions are deflected to the silicon edges, which are heavily negatively charged relative to the dielectric etch base, where they give rise to ion-induced etching and normally corrode large pockets into the silicon. This effect is particularly pronounced in the case of high-density etching plasmas, namely plasmas operating at high ion density, but also in the case of less dense plasmas where the effect is weaker. It is the high-density plasmas in particular, however, that have a decisive role in structuring silicon for micromechanics, for example by the process described in German Patent Application No. DE 42 41 045.

A metallic protective layer, even if it is only a few nm thick, which as described covers the underside of the membranes, totally prevents this structural fidelity-limiting effect. Even after the metallic, namely electrically conductive, etch stop is reached, electrons captured at the silicon side wall region, can continue to reach the positively charged conductive etch base and neutralize them so that no charge accumulation and interfering electric fields can arise in the trenches. Hence, newly arriving ions are not deflected in the region of the silicon edge at the transition to the etch-stopping layer, and pocket formation is prevented.

Moreover, a metallic etch stop layer also constitutes an ideal seal for the membrane underside against the etching gases (fluorine radicals) reaching around the etching edge, because the metals used, for example aluminum, chromium, titanium, copper etc, do not undergo etching. Thus, even when the sacrificial polymer layer adheres poorly under the structures, no etching species can reach around the edge and etch the underside of the structures.

It is a particular advantage that these favorable properties can be attained with even very thin metallic layers, for example a few nm of aluminum. In fact, these protective layers can subsequently be very easily and rapidly removed from between the completely etched-out structures and, if necessary, from below them. In the case of aluminum, for example, this can be done using known wet-chemical etching with HCl, NaOH, $HF/H_3PO_4/CH_3COOH$ etc. Another advantage of this metallic conductive layer is that it can be retained under the structures even when only the metallic surfaces between the etched structures are to be removed. In this case, the free structures prepared from the membrane by trench etching have an unusually good electrically conductive connection with the bulk substrate (the electric conductivity of metallic layers that are only a few nm thick exceeds by orders of magnitude even that of highly doped silicon). A definite advantage in terms of electrical shielding is thus achieved as a result of good material connection.

The micromechanical structures obtained can act, for example, as rotation rate sensors, such as those known from German Patent Application No. DE 1 95 26 903. Other micromechanical sensor or actuator structures can also be envisaged. Part of the required process steps to produce the micromechanical structure may have been completed before the process described in FIGS. 1 to 4 is carried out. After trenches 10 are etched out, metal layer 4 is etched to expose sacrificial layer 5.

Figure 5:
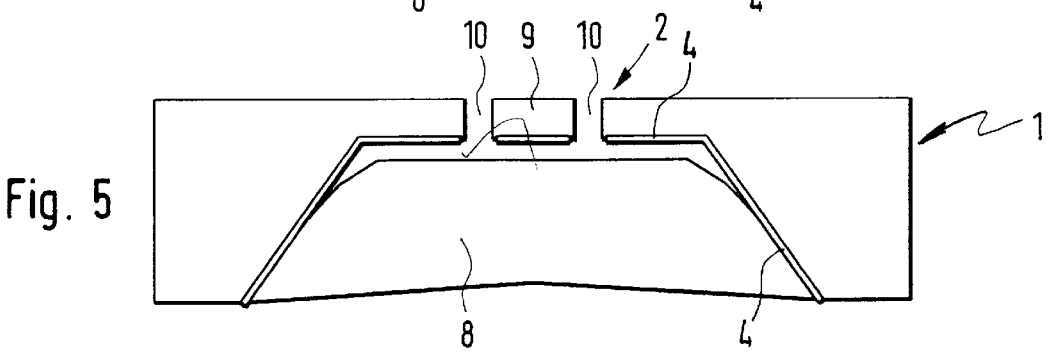
FIG. 5 illustrates a fifth step of the process according to the present invention.

In a subsequent process step, sacrificial layer 5 is then removed. This is done, for example, by dipping the silicon wafer shown in FIG. 4 into a solvent capable of dissolving layer 5. Alternatively, the polymer constituting sacrificial layer 5 is removed by use of a plasma etching process. The stage thus reached is shown in FIG. 5. Trenches 10 form a movable element 9 etched out of membrane region 2, which element can be deflected, for example, by an acceleration. Downward movement of this movable element 9 is limited by sealing layer 8 which acts as a limit stop. The process sequence depicted in FIGS. 1 to 5 thus creates a limit stop by use of very simple means. Metal layer 4 can remain on the underside of membrane region 2 and also on the underside of the movable element. This metal layer 4 may even be desirable and useful, because it forms a low-resistance electrical mass contact or a shield. If this metal layer 4 is to be removed, additional etching can be carried out by dipping into an etching solution appropriate for metal layer 4.

The distance between movable element 9 and seal 8 which acts as a limit stop is determined by the thickness of sacrificial layer 5. Typical dimensions are on the order of a few micrometers to a few tens of micrometers, always depending on the thickness of sacrificial coating 5.

What is claimed is:

1. A process for making a micromechanical structure, comprising the steps of:

forming a cavity in a silicon wafer such that a membrane region is created;

forming a movable element from the membrane region by etching;

creating a limit stop for limiting a deflection of the movable element;

creating a sacrificial layer on an underside of the membrane region;

covering the sacrificial layer with a sealing layer for the limit stop;

introducing trenches in the membrane region starting from a top side of the membrane region, the trenches reaching as far as the sacrificial layer; and removing the sacrificial layer by exposing the sacrificial layer to an etching medium.

2. The process according to claim 1, wherein the sacrificial layer is created by evaporating a polymer solution introduced into the cavity.

3. The process according to claim 2, wherein the evaporation of the polymer solution creates a polymer layer on walls of the cavity, and further comprising the step of removing the polymer layer by etching after the polymer solution has evaporated.

4. The process according to claim 1, wherein the sealing layer includes at least one of a silicone polymer and an epoxy resin.

5. The process according to claim 1, wherein the trenches are introduced by etching, and further comprising the step of providing a metal layer acting as an etch stop on the underside of the membrane region.

6. The process according to claim 5, farther comprising the step of removing the metal layer after the sacrificial layer has been removed.

7. The process according to claim 5, wherein the etch stop includes one of aluminum, chromium, and nickel.

8. The process according to claim 5, wherein the metal layer is provided after the step of forming the cavity is completed.

9. The process according to claim 1, wherein the trenches are introduced by etching with a fluorine-containing plasma.

10. The process according to claim 1, wherein the cavity is formed by anisotropic etching of a single-crystal silicon constituting the silicon wafer.

11. The process according to claim 1, further comprising the step of introducing an amount of polymer solution into the cavity.

12. The process according to claim 1, wherein the step of forming the cavity includes the step of removing an amount of silicon from the silicon wafer.

* * * * *